United States Patent [19]
Kane et al.

[11] Patent Number: 5,620,131
[45] Date of Patent: Apr. 15, 1997

[54] METHOD OF SOLDER BONDING

[75] Inventors: Casey F. Kane, Linden; Joseph Shmulovich, Murray Hill, both of N.J.

[73] Assignee: Lucent Technologies Inc., Murray Hill, N.J.

[21] Appl. No.: 490,878

[22] Filed: Jun. 15, 1995

[51] Int. Cl.$^6$ ............................ B23K 31/02; B23K 37/06
[52] U.S. Cl. ...................... 228/215; 228/180.22; 228/254
[58] Field of Search ............................... 228/180.22, 254, 228/215; 29/840

[56] References Cited

U.S. PATENT DOCUMENTS

| | | | |
|---|---|---|---|
| 5,162,257 | 11/1992 | Yung | 437/183 |
| 5,496,770 | 3/1996 | Park | 228/180.22 |
| 5,536,677 | 7/1996 | Hubacher | 228/180.22 |

FOREIGN PATENT DOCUMENTS

| | | | |
|---|---|---|---|
| 5-144815 | 6/1993 | Japan | 228/180.22 |

OTHER PUBLICATIONS

"Self–Limited C4 Process," *IBM Tech. Discl. Bull.*, vol. 36, No. 10, Oct. 1993, pp. 265–266.

*Primary Examiner*—P. Austin Bradley
*Assistant Examiner*—Jeffrey T. Knapp

[57] ABSTRACT

During formation of solder bumps on the bonding pads of a component, a two-layer dam structure is utilized to block solder from flowing from the pads to adjacent portions of a metallization pattern. After the solder bumps are formed, the top dam layer is dissolved, whereby any solder debris present on the top dam layer is also removed from the structure. The bottom dam layer, which remains intact during the removal step, serves to confine solder movement during a subsequent bonding operation in which the solder bumps are reflowed to cause them to adhere to aligned pads on another component.

12 Claims, 3 Drawing Sheets

METHOD OF SOLDER BONDING

BACKGROUND OF THE INVENTION

This invention relates to a technique for interconnecting components of an electrical assembly and, more particularly, to a method for solder bonding one component to another.

In a variety of applications of practical importance, solder bonding is utilized to attach individual electronic devices such as lasers or light-emitting diodes, or arrrays of such devices, to a mounting substrate. Further, solder bonding is also employed, for example, to bond integrated-circuit chips to a printed-circuit board. Illustratively, aligned patterns of conductive bonding pads are defined on the respective components to be connected. Typically, solder bumps are then formed on the pads of one of the components. Subsequently, the aligned pattern of pads on the other component is brought into contact with the bumps and the solder is melted. In that way, the components are electrically connected together and mechanically attached to each other.

On each component, the bonding pads to which solder is to be adhered are connected to an associated metallization pattern defined on the surface of the component. To prevent molten solder from flowing from a bonding pad area to its associated metallization pattern, either during initial formation of the solder bumps or subsequently during the attachment process, it is customary to interpose a so-called confinement or dam layer between each such pad and its associated metallization. The dam layer, which is made of a material that is substantially non-wettable by molten solder, serves to confine solder to the immediate areas of the respective bonding pads. This insures, for example, that all the solder bumps formed on a component will be of substantially the same height and will remain essentially so during the attachment process. Also, the dam blocks solder from flowing to portions of the metallization pattern where the presence of solder might interfere with subsequent wire-bonding operations.

Subsequent to formation of solder bumps on the aforedescribed bonding pads, it is often observed that randomly shaped and randomly positioned pieces of solder have been deposited on the surface of the dam layer as a result of the solder-bump-formation step. These pieces of solder debris are not securely attached to the surface of the dam layer and are, therefore, relatively free to move. Such movement of the solder debris can easily cause serious electrical, mechanical or optical problems to occur in the final component assembly package.

Accordingly, workers skilled in the art have directed efforts at trying to solve the noted solder debris problem. It was recognized that these efforts, if successful, would increase the manufacturing yield of high-reliability solder-bonded component assemblies and thereby decrease their cost.

SUMMARY OF THE INVENTION

In accordance with the principles of the present invention, each solder dam associated with a bonding pad area of a component is fabricated as a two-layer structure. Following formation of solder bumps on these pad areas, the top layer only of each dam structure is removed, whereby any solder debris on the top surface of the dam is also removed from the component. The remaining bottom layer of the dam serves to confine solder flow during subsequent processing in which the solder is remelted.

In accordance with a particular feature of the invention, the top layer of the dam is removed in an etching solution that contains a surfactant. Vibration of the component during etching dissolves the top layer while causing any solder debris that is present thereon to be removed from the component.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
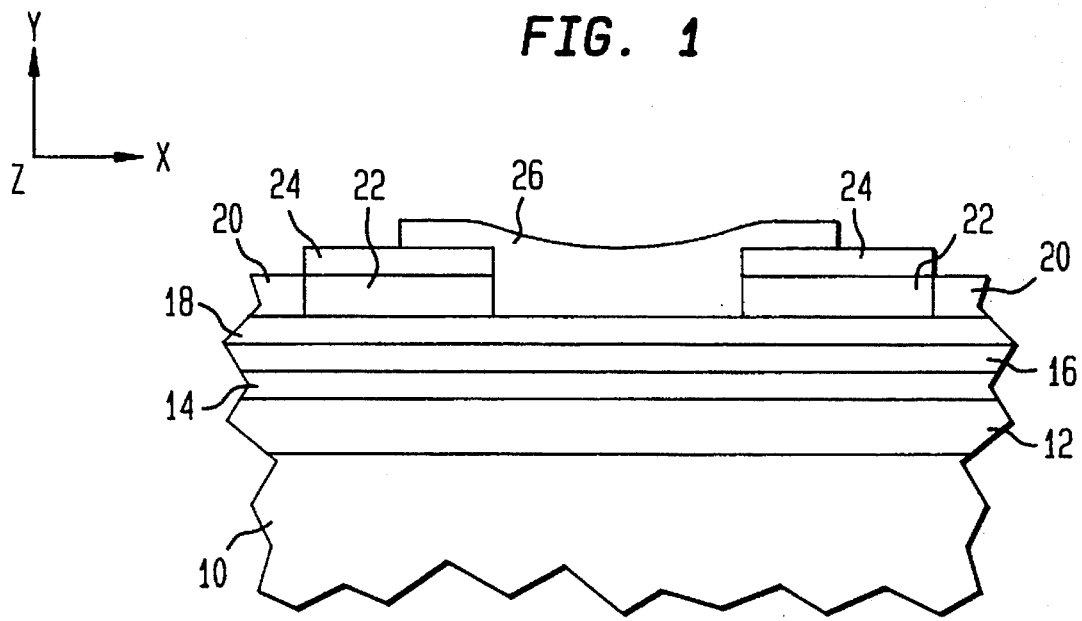
FIG. 1 is a schematic side view of a portion of a component-mounting substrate that includes a deposited solder pattern overlying a bonding pad that includes a specific illustrative two-layer dam structure made in accordance with the principles of the present invention.

By way of a specific example, FIG. 1 shows a portion of a particular substrate on which a component (such as a laser device or an integrated-circuit chip) is designed to be mounted by solder bonding. Illustratively, substrate 10 of FIG. 1 comprises a silicon wafer having a top surface covered by a layer 12 made of a suitable insulating material such as silicon dioxide.

By conventional techniques well known in the semiconductor processing art, metallization is deposited on the entire top surface of the layer 12 and then patterned to form an array of bonding pads and interconnecting conductive lines. For illustrative purposes, a particular conventional four-layer metallization system will be assumed herein. This four-layer system comprises, for example, from bottom to top, layers of titanium, titanium nitride, platinum and gold.

Specifically, as depicted in FIG. 1, the bottom-most layer 14 of the aforementioned metallization pattern comprises, for example, a layer of titanium having a Y-direction thickness of about 250-to-1000 Angstrom units. The next layer 16 comprises a layer of titanium nitride approximately 250 Angstrom units thick. The third layer 18 comprises a layer of platinum about 2000 Angstrom units thick. And the fourth or top-most layer 20 of the illustrative metallization pattern comprises a layer of gold approximately 1000-to-10,000 Angstrom units thick.

The arrangement shown in FIG. 1 also includes a confinement or dam structure that in effect defines those areas of the metallization pattern on which solder bumps will be formed. In accordance with the principles of the present invention, the dam structure of FIG. 1 comprises two patterned layers 22 and 24. The upper layer 24 is a sacrificial layer that is removed during subsequent processing. The lower layer 22 remains on the depicted arrangement to serve as a dam during later processing steps.

The materials of the layers 22 and 24 of the dam shown in FIG. 1 are selected such that their surfaces are substantially not wetted by the formulation utilized to form solder bumps. Also, the material of the bottom layer 22 is selected to be substantially unaffected by the process employed to remove the top layer 24. Thus, for example, if the top layer 24 is to be removed by etching (as described in detail later below), the bottom layer 22 is designed to be largely unaffected by the etching step.

Illustratively, the bottom layer 22 of FIG. 1 comprises a layer of titanium nitride about 250-to-500 Angstrom units thick. The upper layer 24 comprises, for example, a layer of chromium approximately 250-to-500 Angstrom units thick.

A variety of other materials that are not wetted by solder to any substantial extent are available for forming the dam layers 22 and 24. Thus, for example, the bottom layer 22 can be made of titanium nitride or silicon dioxide, while the top layer 24 can be made of titanium, silicon nitride or aluminum oxide. In each case, the top layer of the two-layer dam structure is designed to be removable by a process that does not substantially affect the lower dam layer.

As a prelude to the formation of solder bumps, a solder pattern is defined on the FIG. 1 arrangement in conventional ways. The elements of this solder pattern are respectively defined overlying regions of the metallization that are confined by dam structures. One such specific element 26 is represented in FIG. 1.

The portion of the solder element 26 (FIG. 1) that overlies the top non-wettable surface of the dam layer 24 is substantially not adhered thereto. But the solder element 26 is securely adhered to the top-most layer 18 of the metallization confined within the depicted dam structure. Such attachment maintains the integral solder element 26 securely in place.

Illustratively, the aforementioned solder pattern including the element 26 of FIG. 1 is formed from a deposited (for example, a sputtered or an electron-beam-evaporated) layer about one-to-six micrometers (μm) thick. Various known solder formulations are suitable for this purpose. One such advantageous solder comprises a eutectic gold/tin mixture whose atomic percentage of gold to tin is about 70:30. Patterning such a thin-film layer of solder utilizing standard lithographic and lift-off techniques is straightforward.

During formation of the two-layer dam structure shown in FIG. 1, the top gold layer of the aforespecified illustrative metallization pattern is typically removed from the area directly underlying the dam. Furthermore, during deposition of the solder layer, the portion of the gold layer confined within the dam structure is dissolved by the solder. Thus, in the specific illustrative example described herein, the area directly below the dam as well as that directly below the area confined within the dam comprises a gold-less three-layer metallization, as indicated in FIG. 1.

Figure 2:
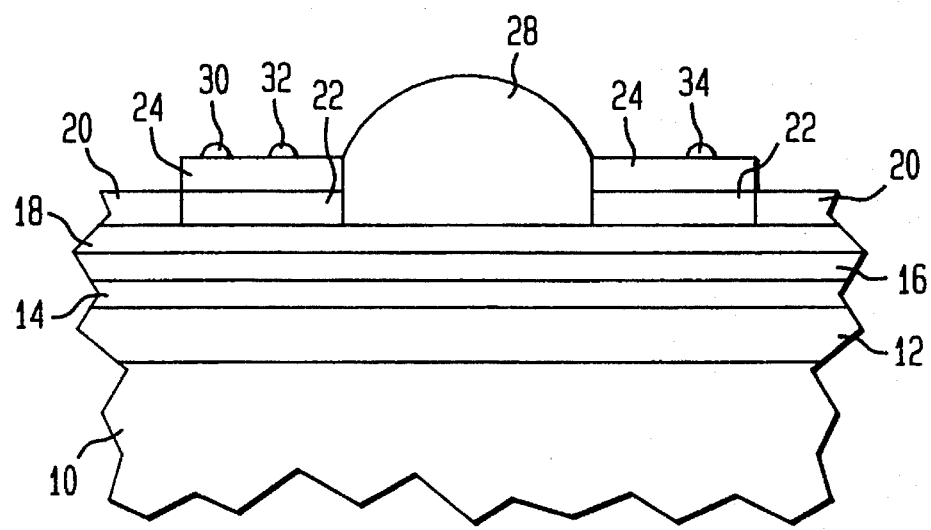
FIG. 2 shows the FIG. 1 arrangement after the deposited solder has been flowed to form a solder bump.

Subsequently, the FIG. 1 arrangement is processed to form solder bumps thereon. For the particular illustrative solder formulation specified above, this is accomplished, for example, by processing the arrangement in a reducing atmosphere at about 300 degrees Celsius for approximately five seconds. As a result of this step and due to surface-tension effects, the patterned solder elements (such as the element 26 of FIG. 1) move off of the surface of the dam layer 24 and form domed bumps directly overlying the metallization confined within the dam structure, in a manner well known in the art. One such solder bump is shown in FIG. 2 wherein it is designated by reference numeral 28. Illustratively, the height of each such bump is approximately five-to-twenty-five μm.

Importantly, because of the blocking action of the indicated dam structure, the molten solder does not wick or flow to adjacent gold-layer areas during bump formation. As a result of this controlled confinement of solder, all of the solder bumps end up having substantially the same height, which is a required condition for reliable solder bonding.

In practice, it has been observed that some randomly shaped and randomly positioned pieces of solder sometimes remain on the top surface of the dam after formation of the solder bumps. Several such pieces 30, 32 and 34 of solder debris are represented in FIG. 2.

Because of the non-wettable nature of the surface of the top dam layer 24 (FIG. 2), the solder pieces 30, 32 and 34 are not securely adhered to the surface of the layer 24. Thus, these pieces, if not completely removed from the structure, can later move relatively easily from the indicated surface to other parts of the component assembly package. And, in so moving, this debris can, for example, cause electrical shorts, mechanical damage or optical interference in the final assembly.

In accordance with the principles of the present invention, all of the aforementioned solder debris is dislodged and removed from the indicated surface in an effective way. The manufacturing yield of high-reliability solder-bonded component assemblies is thereby significantly enhanced.

In accordance with the invention, the debris-removal process comprises removing the top or sacrificial layer 24 of the two-layer dam structure shown in FIG. 2. In the process of removing the layer 24, the solder pieces 30, 32 and 34 are also removed. At the same time, the bottom dam layer 22 is retained in place substantially intact.

Illustratively, the top dam layer 24 of FIG. 2 is removed in an etching step. This is done by utilizing an etchant that dissolves the layer 24 but which does not substantially attack the bottom layer 22 (or any other layers of the depicted structure). For the particular case in which the top layer 24 is made of chromium, a suitable etchant therefor is, for example, a mixture of ceric ammonium nitrate, acetic acid and water, which is commercially available from Foto Chemical Systems, Inc., Wayne, N.J., as an etching solution designated C. A. N. This solution is, for example, diluted 1:1 by volume with water prior to being used to etch the layer 24.

Other suitable etchants for the layer 24 are well known. Thus, for example, hydrochloric acid is effective to etch the layer 24 without substantially attacking the layer 22.

Even as the layer 24 is dissolved by etching, the solder-debris pieces may get electrostatically charged and thereby may be difficult to disengage from the FIG. 2 structure. For this reason, it is generally advantageous to add a suitable surfactant to the etching solution to facilitate complete removal of solder debris from the indicated structure. One exemplary such surfactant comprises, for example, alkylaryl polyether alcohol, which, for example, is commercially available from J. T. Baker, Inc., Phillipsburg, N.J., as a surfactant designated Triton X-100. Illustratively, Triton X-100 is diluted with water (about 1:100 parts by volume) and then added to an etchant such as C. A. N. in a C. A. N.-to-Triton X-100 volume ratio of approximately 4:1.

Advantageously, while the FIG. 2 structure is contained in a vessel immersed in the etching-surfactant solution, the vessel is vibrated. This facilitates the etching process and removal of solder debris from the structure. For example, vibration at 5-to-50 Hertz with a conventional vibrator (such as a Syntron Jogger Model J-1 made by FMC Corp.) is effective to insure that the solder pieces are completely dislodged from the structure and end up in the solution separated from the FIG. 2 structure.

Etching, while vibrating, in the aforespecified illustrative solution removes the top dam layer 24 of FIG. 2 while leaving the bottom dam layer 22 substantially intact. By this illustrative technique, a dam layer 24 comprising a 1000-Angstrom-unit-thick layer of chromium is removed in, for example, about five minutes.

After removing the structure from the etching bath, it is advantageous to wash the structure in, for example, deionized water. After being dried, the structure is then ready for subsequent processing in a standard solder-bonding operation.

Figure 3:
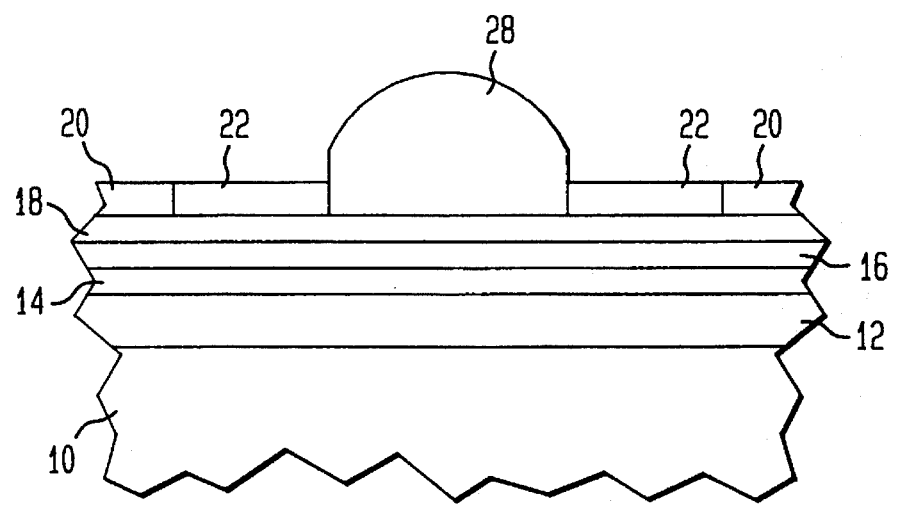
FIG. 3 depicts the FIG. 2 structure after the top layer of the dam has been removed.

FIG. 3 shows the herein-described structure after the top dam layer 24 and the solder pieces 30, 32 and 34 have been removed. As indicated earlier, the bottom layer 22 of the original two-layer dam structure remains intact. Thus, when the solder bumps (such as the bump 28 of FIG. 3) are subsequently heated to effect electrical and mechanical bonds between the depicted structure and bonding pads on an associated component, the layer 22 is effective to block molten solder from flowing to adjacent gold areas of the metallization pattern.

Figure 4:
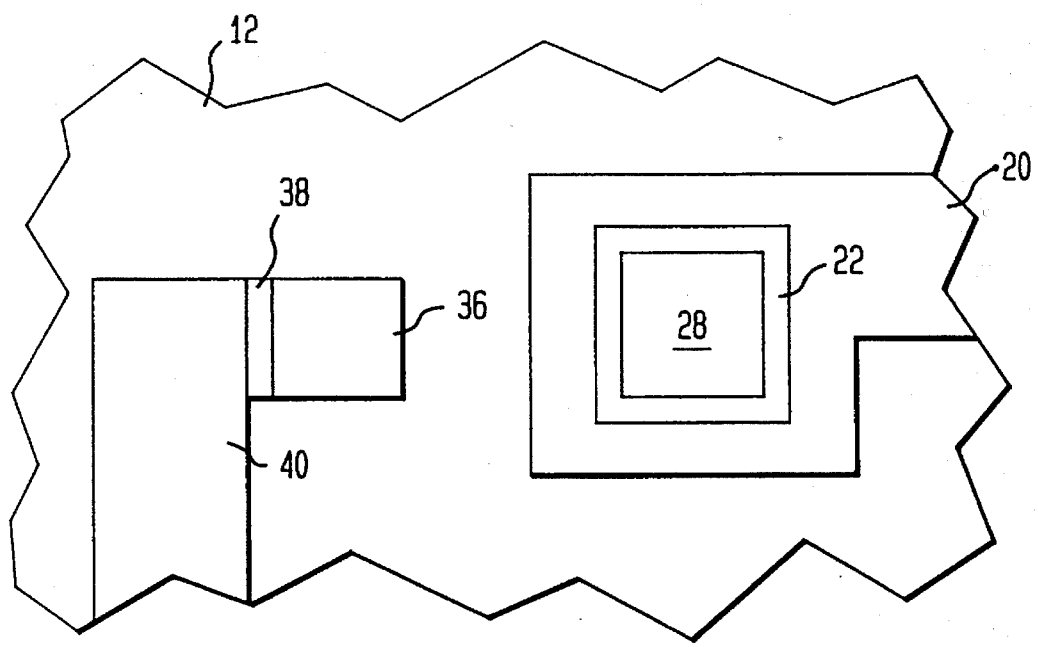
FIG. 4 is a top view of a portion of the component represented in FIGS. 1 through 3.

FIG. 4, which is a top view of a portion of a structure of the type depicted in FIGS. 1 through 3, shows the remaining dam layer 22 surrounding the solder bump 28. It is apparent that during a subsequent bonding operation the dam 22 is positioned to prevent molten solder from flowing to the adjacent gold area 20.

FIG. 4 also shows another illustrative solder bump 36 adhered to an underlying bonding pad. Layer 38 of FIG. 4 constitutes the remaining layer of what was originally a two-layer dam structure. The top or sacrificial layer overlying the dam layer 38 was removed in the same processing step in which the aforedescribed sacrificial dam layer 24 was removed. The remaining dam layer 38 prevents molten solder from flowing to an adjacent gold area 40 during a subsequent bonding operation. (Note that, since no part of the metallization pattern extends to the right or above or below the solder bump 36, the particular dam layer 38 illustrated in FIG. 4 need extend only along the left-hand edge of the bump 36.)

During the actual solder-bonding operation, a component such as the one shown in FIG. 4 is designed to be connected to another component. This other component can, for example, simply be a device with electrical leads. In that case, each lead would be aligned with a respective one of the solder bumps shown in FIG. 4 and bonded thereto. Herein, however, for illustrative purposes, the other component will be assumed to be of the particular type of component 42 which is represented in a simplified manner in FIG. 5. By way of a specific example, the component 42 of FIG. 5 contains an array of spaced-apart conductive bonding pads schematically illustrated by the pads 44 and 46. These pads are defined on an insulating substrate 48. Dams (not shown in the simplified showing of FIG. 5) may be associated with the pads 44 and 46 to prevent molten solder from flowing to adjacent portions of the metallization on the substrate 48 during the solder-bonding operation. Importantly, the pattern of bonding pads including the pads 44 and 46 of the component 42 substantially exactly matches the pattern of bonding pads that includes the pads underlying the solder bumps 28 and 36 of FIG. 4.

Figure 5:
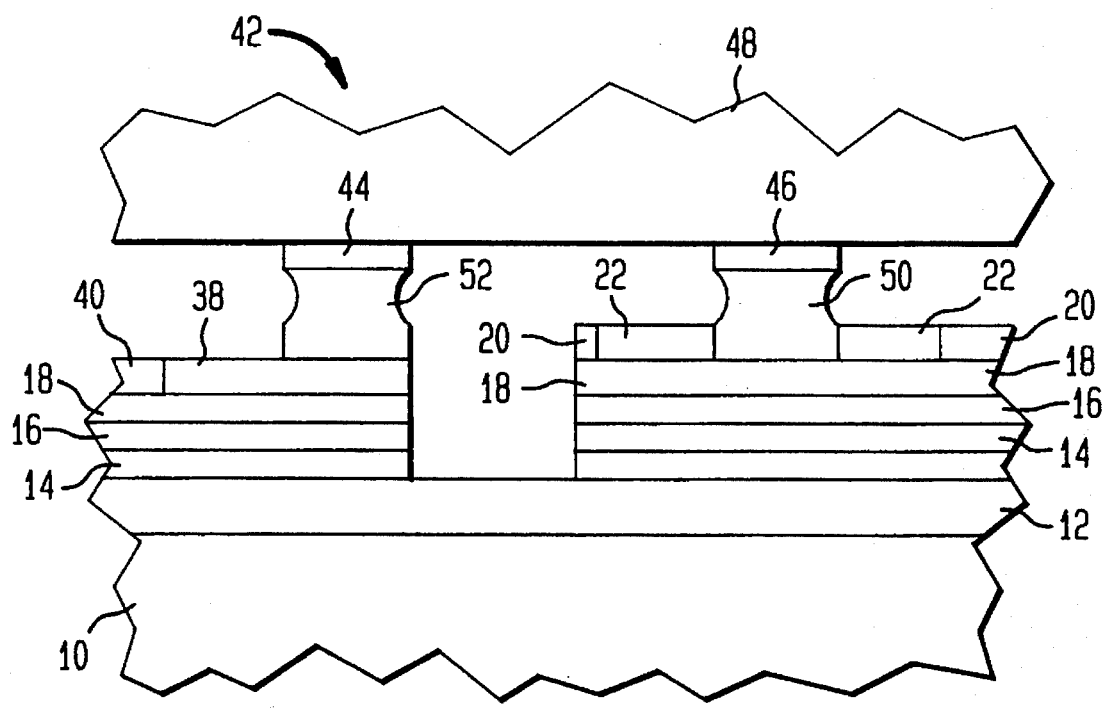
FIG. 5 is a side view of the component depicted in FIG. 4, showing it solder bonded to another component.

With the domed solder bumps of FIG. 4 in contact with the pads 44 and 46 of FIG. 5, the solder is reheated to cause it to reflow. Illustratively, this is done by heating the solder to a temperature of approximately 300 degrees Celsius for about 20 seconds in a reducing atmosphere. During this heating step, the solder bumps 28 and 36 of FIG. 4 melt and flow to assume the shapes represented in FIG. 5 by solder elements 50 and 52. After the heating step, the solder resolidifies, with the resolidified solder element 50 securely bonded to the layer 18 and to the pad 46, while the resolidified solder element 52 is securely bonded to another portion of the layer 18 and to the pad 44. Electrical and mechanical connections between the two depicted components are thereby established.

Finally, it is to be understood that the above-described techniques and materials are only illustrative of the principles of the present invention. In accordance with these principles, numerous modifications and alternatives may be devised by those skilled in the art without departing from the spirit and scope of the invention.

What is claimed is:

1. A method of solder bonding comprising the steps of forming a conductive metallization pattern, including bonding pads, on the surface of a component, forming a two-layer dam structure, including a top sacrificial dam layer and a bottom permanent dam layer, on each of said pads to define a portion of each pad to which solder is to be adhered, each of said top and bottom dam layers being characterized by being substantially non-wettable by solder, said dam structure being adapted to prevent molten solder from flowing from said defined pad portion to adjacent portions of the metallization pattern during subsequent solder-bump-formation and bonding steps, forming respective solder bumps on said defined pad portions, said top sacrificial dam layer on each pad portion being adapted during solder-bump formation to prevent molten solder from flowing from said defined pad portion to adjacent portions of the metallization pattern, removing the top sacrificial layer of said dam structure, and, while maintaining conductive elements of an associated component in respective contact with said solder bumps, heating said solder bumps to bond said respective elements to said defined pad portions, said bottom dam layer on each pad portion being adapted during bonding to prevent molten solder from flowing from said defined pad portion to adjacent portions of the metallization pattern.

2. A method as in claim 1 wherein said removing step comprises etching said top sacrificial layer in a solution that dissolves said top layer but which does not dissolve said bottom permanent layer to any substantial extent.

3. A method as in claim 2 wherein a surfactant is added to said etching solution.

4. A method as in claim 3 wherein said removal step is carried out in a container that is vibrated during etching.

5. A method as in claim 4 wherein said top sacrificial layer comprises chromium.

6. A method of solder bonding comprising the steps of forming a conductive metallization pattern, including bonding pads, on the surface of forming a two-layer dam structure, including a top sacrificial layer and a bottom permanent layer, on each of said pads to define a portion of each pad to which solder is to be adhered, said dam structure being adapted to prevent molten solder from flowing from said defined pad portion to adjacent portions of the metallization pattern, forming respective solder bumps on said defined pad portions, removing the top sacrificial layer of said dam structure, and while maintaining conductive elements of an associated component in respective contact with said solder bumps, heating said solder bumps to bond said respective elements to said defined pad portions, wherein said removing step comprises etching said top sacrificial layer in a solution that dissolves said top layer but which does not dissolve said bottom permanent layer to any substantial extent, wherein a surfactant is added to said etching solution, wherein said removal step is carried out in a container that is vibrated during etching, wherein said top sacrificial layer comprises chromium, and wherein said bottom permanent layer comprises titanium nitride.

7. A method as in claim 6 wherein said etching solution comprises a mixture of ceric ammonium nitrate, acetic acid and water.

8. A method as in claim 7 wherein said surfactant comprises alkylaryl polyether alcohol.

9. A method as in claim 8 wherein said chromium layer is approximately 500-to-1000 Angstrom units thick.

10. A method as in claim 9 wherein said titanium nitride layer is approximately 250-to-500 Angstrom units thick.

11. A method as in claim 10 wherein said container is vibrated at 5-to-50 Hertz during the removal step.

12. A method as in claim 11 wherein said solder comprises a eutectic gold/tin mixture.

* * * * *